US007257508B2

(12) United States Patent
Sato

(10) Patent No.: US 7,257,508 B2
(45) Date of Patent: Aug. 14, 2007

(54) TIMING GENERATOR, AND TIMING GENERATING METHOD

(75) Inventor: Naoki Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 4 days.

(21) Appl. No.: 11/223,892

(22) Filed: Sep. 9, 2005

(65) Prior Publication Data

US 2007/0061097 A1 Mar. 15, 2007

(51) Int. Cl.
*G06F 19/00* (2006.01)
(52) U.S. Cl. ............... 702/125; 702/79; 702/176; 348/312; 714/731; 340/3.2
(58) Field of Classification Search ............... 702/125, 702/176, 177, 178, 79; 348/312; 714/731; 340/3.2
See application file for complete search history.

(56) References Cited

U.S. PATENT DOCUMENTS 6,134,276 A * 10/2000 Aman et al. ............... 375/326
6,151,071 A * 11/2000 Petilli ............................ 348/312
6,727,957 B1 * 4/2004 Sato ............................ 348/526

OTHER PUBLICATIONS

Kurita et al., 'PLL-Based BiCMOS On-Chip Clock Generator for Very High-Speed Microprocessor', Apr. 1991, IEEE Publication, vol. 26, No. 4, pp. 585-589.*

Ronan et al., 'Timing and RF Synchronization for Filling PEP/SPEAR with the SLC Damping Rings', 1989, IEEE Publication, pp. 1577-1579.*

* cited by examiner

*Primary Examiner*—Edward Raymond
*Assistant Examiner*—Elias Desta
(74) *Attorney, Agent, or Firm*—Osha Liang LLP

(57) ABSTRACT

There is provided a timing generator that outputs a second periodic signal having a desired phase difference to a first periodic signal by superimposing a voltage on a control voltage of a voltage-controlled oscillating unit of a PLL circuit for generating the second periodic signal. The timing generator includes an initializing unit for measuring a timing shift gain indicative of a ratio of a timing shift amount to a change of a superimposed voltage and a voltage generating unit for generating the superimposed voltage based on the desired phase difference and the timing shift gain. The initializing unit harmonizes the phase of the first periodic signal with the phase of the second periodic signal, sequentially changes the superimposed voltage, detects an amount of change of the superimposed voltage when the phase of the first periodic signal and the phase of the second periodic signal are identical with each other once more, and computes a timing shift gain based on the change amount of the superimposed voltage and an amount of change of the phase of the second periodic signal.

7 Claims, 6 Drawing Sheets

TIMING GENERATOR, AND TIMING GENERATING METHOD

BACKGROUND OF THE INVENTION

1. Field of the Invention

The present invention relates to a timing generator and a timing generating method generating strobe signals of desired timing and a test apparatus testing a device under test.

2. Description of Related Art

Conventionally, there has been known a method using PLL (Phase Lock Loop) as a method generating clock signals of a desired phase. The method is a method superimposing a desired voltage on a control voltage to be supplied to a voltage-controlled oscillator in the PLL in order to shift phases of clock signals according to the superimposed voltage.

Now, since a related patent document is not recognized, the description is omitted.

However, when shifting phases of clock signals by means of a voltage-controlled oscillator, some errors may be observed between a set shift amount and a real shift amount. For this reason, an initialization has conventionally been performed by previously measuring relation between a voltage being superimposed on a control voltage of a voltage-controlled oscillator and a real shift amount.

For example, the relation between a superimposed voltage and a phase shift amount can be measured by superimposing two kinds of voltages on a control voltage of a voltage-controlled oscillator and detecting an amount of phase shift for each superimposed voltage. In this case, it is necessary to accurately detect the amount of phase shift. However, in order to accurately detect the amount of phase shift, it is necessary to measure the amount of phase shift, e.g., using a loop circuit. Therefore, a measurement error has been observed due to a delay in the loop circuit.

SUMMARY OF THE INVENTION

Therefore, it is an object of the present invention to provide a timing generator, a test apparatus, and a timing generating method that can solve the foregoing problems. The above and other objects can be achieved by combinations described in the embodiments of the invention. The embodiments of the invention define further advantageous and exemplary combinations of the present invention.

To solve this problem, according to the first aspect of the present invention, there is provided a timing generator that outputs a second periodic signal having a desired phase difference to a first periodic signal. The timing generator includes: a voltage-controlled oscillating unit for outputting an oscillation signal with frequency according to a given control voltage as the second periodic signal; and a timing controlling unit for superimposing a superimposed voltage according to the phase difference of the second periodic signal to the first periodic signal on the control voltage in order to supply the voltage to the voltage-controlled oscillating unit, in which the timing controlling unit includes: an initializing unit for measuring a timing shift gain indicative of a ratio of a timing shift amount of the oscillation signal output from the voltage-controlled oscillating unit to a change of the superimposed voltage; and a voltage generating unit for generating the superimposed voltage based on a timing shift amount according to the desired phase difference of the second periodic signal and the timing shift gain, and the initializing unit includes: a first phase adjusting means for shifting a phase of at least one of the first periodic signal and the second periodic signal with respect to a phase of the other and harmonizing the phase of the first periodic signal with the phase of the second periodic signal; a second phase adjusting means for sequentially changing the superimposed voltage supplied by the voltage generating unit to the voltage-controlled oscillating unit and detecting an amount of change of the superimposed voltage when the phase of the first periodic signal and the phase of the second periodic signal are identical with each other once more, on condition that an amount of phase shift by the first phase adjusting means is held; and a gain computing unit for computing the timing shift gain based on an amount of change of phase of the second periodic signal to the first periodic signal caused by changing the change amount of the superimposed voltage detected from the second phase adjusting means and the superimposed voltage.

The second phase adjusting means may sequentially change the superimposed voltage generated from the voltage generating unit so that the phase of the second periodic signal is changed within a range including an amount of change of a predetermined integral multiple of a period of the first periodic signal. The second phase adjusting means may sequentially change the superimposed voltage so that the phase of the second periodic signal is changed within a range below one period of the first periodic signal before and behind the change amount of the predetermined integral multiple of a period of the first periodic signal, and the gain computing unit may compute the timing shift gain by dividing a shift amount of the predetermined integral multiple of a period of the first periodic signal by the change amount of the superimposed voltage.

The timing generator may further include a range storing unit for previously storing information indicative of a range of the superimposed voltage in which the voltage-controlled oscillating unit operates linearly, the voltage generating unit may previously generate the generally lowest superimposed voltage within the range stored on the range storing unit when the first phase adjusting means harmonizes the phase of the first periodic signal with the phase of the second periodic signal, and the first phase adjusting means may further change the phase of the second periodic signal and harmonize the phase of the first periodic signal with the phase of the second periodic signal, on condition that the generally lowest superimposed voltage is superimposed on the control voltage.

The gain computing unit may previously store a theoretical value of a period of the first periodic signal and compute the timing shift gain by dividing a value, which is obtained by multiplying the theoretical value of a period of the first periodic signal by the predetermined integer, by the change amount of the superimposed voltage.

According to the second aspect of the present invention, there is provided a test apparatus testing a device under test. The test apparatus includes: a pattern generating unit for supplying a test pattern to the device under test according to a given timing signal; a signal detector for detecting a signal value of an output signal output from the device under test according to the test pattern at the timing of a given strobe signal; a timing generator for generating the timing signal and the strobe signal and supplying these signals to the pattern generating unit and the signal detector; and a decider for deciding the good or bad of the device under test based on the signal value detected from the signal detector, in which the timing generator includes: a first voltage-controlled oscillating unit for outputting an oscillation signal with frequency according to a given control voltage as the timing signal; a second voltage-controlled oscillating unit for outputting an oscillation signal with frequency according to a given control voltage as the strobe signal; and a timing controlling unit for superimposing a superimposed voltage according to the phase difference, which the strobe signal and the timing signal should have, on the control voltage in order to supply the voltage to the first voltage-controlled oscillating unit and the second voltage-controlled oscillating unit, the timing controlling unit includes: an initializing unit for measuring a timing shift gain indicative of a ratio of a timing shift amount of the oscillation signal, which is output from the first voltage-controlled oscillating unit and the second voltage-controlled oscillating unit, to a change of the superimposed voltage; and a voltage generating unit for generating the superimposed voltage based on a timing shift amount according to the phase difference that the strobe signal and the timing signal should have and the timing shift gain, and the initializing unit includes: a first phase adjusting means for shifting a phase of at least one of the timing signal and the strobe signal with respect to a phase of the other and harmonizing the phase of the timing signal with the phase of the strobe signal; a second phase adjusting means for sequentially changing the superimposed voltage supplied by the voltage generating unit to the voltage-controlled oscillating unit and detecting an amount of change of the superimposed voltage when the phase of the first periodic signal and the phase of the second periodic signal are identical with each other once more, on condition that an amount of phase shift by the first phase adjusting means is held; and a gain computing unit for computing the timing shift gain based on an amount of change of phase of the second periodic signal to the first periodic signal caused by changing the change amount of the superimposed voltage detected from the second phase adjusting means and the superimposed voltage.

According to the third aspect of the present invention, there is provided a timing generating method of generating a second periodic signal having a desired phase difference to a first periodic signal. The timing generating method includes: a voltage-controlled oscillating step of outputting an oscillation signal with frequency according to a given control voltage as the second periodic signal; and a timing controlling step of superimposing a superimposed voltage according to the phase difference of the second periodic signal to the first periodic signal on the control voltage in order to supply the voltage to the voltage-controlled oscillating step, in which the timing controlling step includes: an initializing step of measuring a timing shift gain indicative of a ratio of a timing shift amount of the oscillation signal output from the voltage-controlled oscillating step to a change of the superimposed voltage; and a voltage generating step of generating the superimposed voltage based on a timing shift amount according to the desired phase difference of the second periodic signal and the timing shift gain, and the initializing step includes: a first phase adjusting step of shifting a phase of at least one of the first periodic signal and the second periodic signal with respect to a phase of the other and harmonizing the phase of the first periodic signal with the phase of the second periodic signal; a second phase adjusting step of sequentially changing the superimposed voltage supplied by the voltage generating step to the voltage-controlled oscillating step and detecting an amount of change of the superimposed voltage when the phase of the first periodic signal and the phase of the second periodic signal are identical with each other once more, on condition that an amount of phase shift in the first phase adjusting step is held; and a gain computing step of computing the timing shift gain based on an amount of change of phase of the second periodic signal to the first periodic signal caused by changing the change amount of the superimposed voltage detected in the second phase adjusting step and the superimposed voltage.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
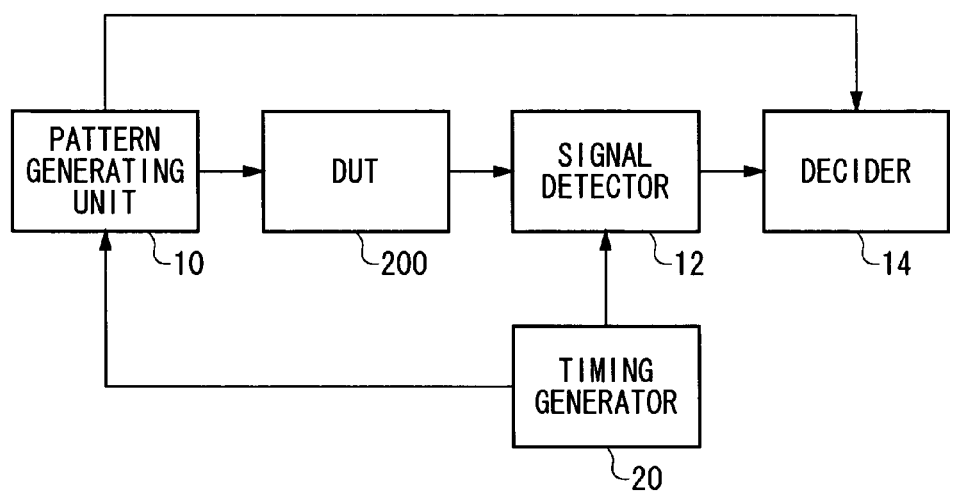
FIG. 1 is a view exemplary showing a configuration of a test apparatus according to an embodiment of the present invention.

FIG. 1 is a view exemplary showing a configuration of a test apparatus 100 according to an embodiment of the present invention. The test apparatus 100 is an apparatus testing a device under test such as a semiconductor circuit, and includes a pattern generating unit 10, a signal detector 12, a decider 14, and a timing generator 20.

The pattern generating unit 10 generates a test pattern testing a device under test 200 according to a given timing signal, and supplies the generated pattern to the device under test 200. The signal detector 12 detects a signal value of an output signal output from the device under test 200 according to the test pattern at the timing of a given strobe signal. For example, the signal detector 12 may be a comparator that is provided for each pin of the device under test 200.

The timing generator 20 outputs a timing signal and a strobe signal at desired timing. In this example, the timing generator 20 generates a timing signal prescribing output timing, a period, and soon of the test pattern generated from the pattern generating unit 10. Moreover, the timing generator 20 outputs a strobe signal according to the timing at which the signal detector 12 should detect the output signal value.

The decider 14 decides the good or bad of the device under test 200 based on the output signal value detected from the signal detector 12. For example, the decider 14 decides the good or bad of the device under test 200 by comparing an expectation pattern generated from the pattern generating unit 10 based on the test pattern and the signal value detected from the signal detector 12.

Figure 2:
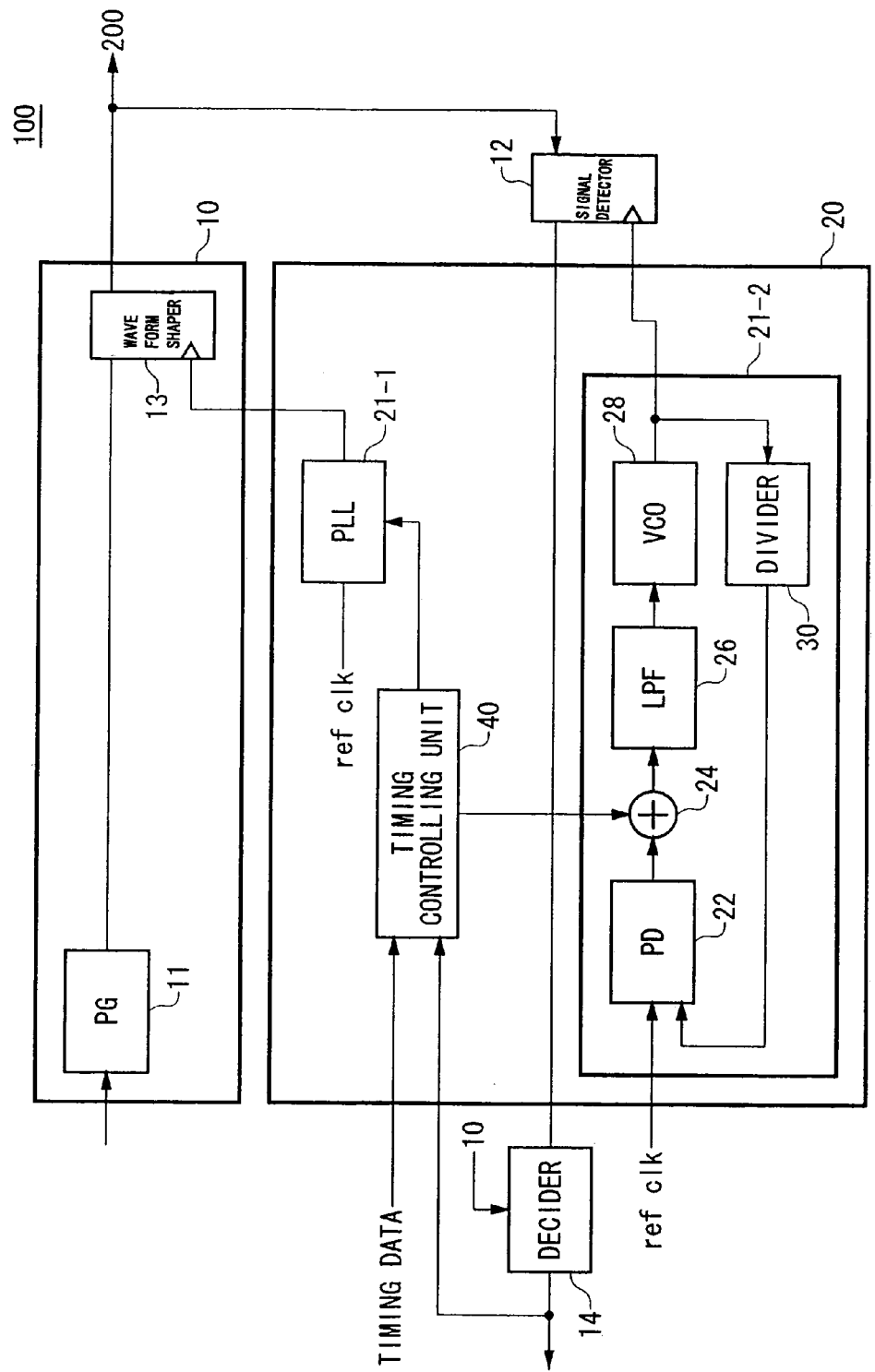
FIG. 2 is a view exemplary showing a detailed configuration of the test apparatus.

FIG. 2 is a view exemplary showing a detailed configuration of the test apparatus 100. In this example, the pattern generating unit 10 has a pattern generator 11 and a waveform shaper 13. Moreover, the timing generator 20 has a first PLL circuit 21-1, a second PLL circuit 21-2, and a timing controlling unit 40. The first PLL circuit 21-1 generates a timing signal with desired frequency using a given reference clock as a standard. Moreover, the second PLL circuit 21-2 generates a strobe signal with desired frequency using the reference clock as a standard. Since the first PLL circuit 21-1 and the second PLL circuit 21-2 have the same configuration, the configuration of the second PLL circuit 21-2 will be described in this example. The second PLL circuit 21-2 includes a phase comparing unit 22, a superimposing unit 24, a low-pass filter 26, a voltage-controlled oscillating unit 28, and a divider 30.

The phase comparing unit 22, the low-pass filter 26, the voltage-controlled oscillating unit 28, and the divider 30 constitute so-called a PLL (Phase Lock Loop). The voltage-controlled oscillating unit 28 outputs an oscillation signal with frequency according to a given control voltage as a strobe signal. The phase comparing unit 22 compares a phase of a strobe signal received through the divider 30 and a phase of a given reference clock, and outputs a control voltage according to the difference between these phases.

Here, the reference clock is a clock of which a period does not vary. For example, the reference clock may be a clock to be distributed to each component in order to operate each component of the test apparatus 100. Moreover, the reference clock is generated by a circuit different from the PLL included in the timing generator 20.

The timing controlling unit 40 superimposes a superimposed voltage according to desired timing, at which a timing signal and a strobe signal should be output, on the control voltage output from the phase comparing unit 22 in each of the first PLL circuit 21-1 and the second PLL circuit 21-2, and supplies the voltage to the voltage-controlled oscillating unit 28. In this example, the timing controlling unit 40 outputs the superimposed voltage to the superimposing unit 24. The superimposing unit 24 is provided between the phase comparing unit 22 and the voltage-controlled oscillating unit 28, and adds the superimposed voltage output from the timing controlling unit 40 to the control voltage output from the phase comparing unit 22 in order to supply the result to the voltage-controlled oscillating unit 28 via the low-pass filter 26. By such a configuration, the phase of the strobe signal output from the voltage-controlled oscillating unit 28 can be shifted according to the superimposed voltage, and the timing signal and the strobe signal can be output at the desired timing.

When testing the device under test 200, the timing signal and the strobe signal may have a desired phase difference. Before testing the device under test 200, the timing controlling unit 40 previously measures a timing shift gain indicative of a ratio of a timing shift amount of the oscillation signal output from the voltage-controlled oscillating unit 28 to a change of the superimposed voltage. Then, when testing the device under test 200, the superimposed voltage according to the phase difference that the timing signal and the strobe signal should have is supplied to the first PLL circuit 21-1 and the second PLL circuit 21-2.

The measurement of the timing shift gain is performed by detecting the pattern output from the pattern generating unit 10 according to the timing signal by means of the signal detector 12 according to the strobe signal. In this case, the detection result from the signal detector 12 may be supplied to the timing controlling unit 40 via the decider 14.

Figure 3:
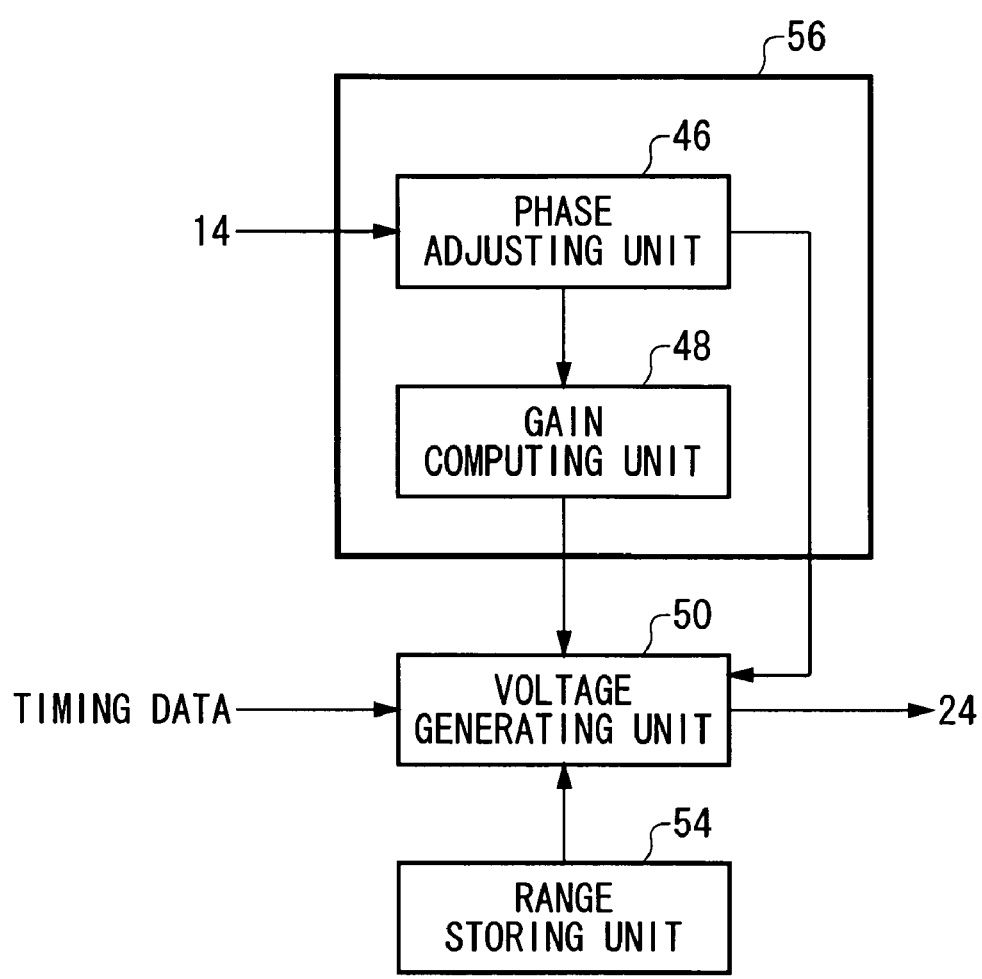
FIG. 3 is a view exemplary showing a configuration of a timing controlling unit.

FIG. 3 is a view exemplary showing a configuration of the timing controlling unit 40. The timing controlling unit 40 includes an initializing unit 56, a voltage generating unit 50, and a range storing unit 54. Before testing the device under test 200, the initializing unit 56 previously measures a timing shift gain indicative of a ratio of a timing shift amount of the oscillation signal output from the voltage-controlled oscillating unit 28 to a change of the superimposed voltage. In other words, the initializing unit 56 computes an inclination of a characteristic of the superimposed voltage change amount and the timing shift amount. The timing shift gain can be computed by superimposing, e.g., two kinds of superimposed voltages on a control voltage in order to detect a phase of an oscillation signal for each superimposed voltage and dividing an amount of change of the phase of the oscillation signal by an amount of change of the superimposed voltage.

The voltage generating unit 50 generates a superimposed voltage superimposed on the control voltage to be supplied to the voltage-controlled oscillating unit 28. For example, when testing the device under test 200, the voltage generating unit 50 generates the superimposed voltage based on the timing shift amount according to the desired timing at which the strobe signal should be output and the timing shift gain measured by the initializing unit 56. For example, the voltage generating unit 50 computes a voltage value of the superimposed voltage to be generated by dividing the timing shift amount by the timing shift gain. In this example, the timing shift amount is given as timing data.

The initializing unit 56 has a phase adjusting unit 46 and a gain computing unit 48. The phase adjusting unit 46 compares the phase of the strobe signal with the phase of the pattern signal (the timing signal) based on the signal from the decider 14. The phase adjusting unit 46 changes the superimposed voltage generated from the voltage generating unit 50, and detects whether the phase of the pattern signal and the phase of the strobe signal are identical with each other. In this case, for example, the decider 14 is supplied with a value fixed to an H level or an L level as an expected value, and may decide that the phase of the pattern signal and the phase of the strobe signal have been identical with each other when a decision result is replaced.

When measuring the timing shift gain, the phase adjusting unit 46 firstly shifts a phase of at least one of the timing signal and the strobe signal with respect to a phase of the other and harmonizes the phase of the timing signal with the phase of the strobe signal. For example, until correspondence between the phases is detected as described above, the phase adjusting unit 46 harmonizes the phase of the pattern signal with the phase of the strobe signal by changing the superimposed voltage to be supplied to the first PLL circuit 21-1 or the second PLL circuit 21-2.

At this time, the voltage generating unit 50 may generate the superimposed voltage within a predetermined range. For example, the voltage generating unit 50 generates the generally lowest superimposed voltage within a range of the superimposed voltage operating the voltage-controlled oscillating unit 28 linearly, and the phase adjusting unit 46 may gradually increase the superimposed voltage output from the voltage generating unit 50. Here, the range of the superimposed voltage linearly operating the voltage-controlled oscillating unit 28 means a range, in which a phase shift amount of the oscillation signal output from the voltage-controlled oscillating unit 28 varies linearly, in connection with a change of the superimposed voltage superimposed on the control voltage of the voltage-controlled oscillating unit 28. The range of the superimposed voltage may previously be stored on the range storing unit 54. The voltage generating unit 50 may generate the generally lowest superimposed voltage according to an instruction from the phase adjusting unit 46. Then, the phase adjusting unit 46 shifts the phase of the strobe signal and harmonizes the phase of pattern signal with the phase of the strobe signal on condition that the generally lowest superimposed voltage has been superimposed on the control voltage.

The phase adjusting unit 46 may hold a voltage value of the superimposed voltage at which the phase of pattern signal and the phase of strobe signal are identical with each other. Then, the phase adjusting unit 46 sequentially changes the superimposed voltage supplied by the voltage generating unit 50 to the voltage-controlled oscillating unit 28, and detects an amount of change of the superimposed voltage when the phase of pattern signal and the phase of strobe signal are identical with each other once more. For example, the phase adjusting unit 46 detects the change amount by the difference between the held voltage value and the voltage value of the superimposed voltage when the phase of pattern signal and the phase of strobe signal have been identical with each other once more. Moreover, the phase adjusting unit 46 may generate a voltage gradually increased or gradually decreased.

The gain computing unit 48 computes the timing shift gain based on an amount of change of a phase of the strobe signal caused by changing the change amount of the superimposed voltage detected from the phase adjusting unit 46 and the superimposed voltage. As described above, since the phase of pattern signal and the phase of strobe signal are identical with each other before and after changing the superimposed voltage, the change amount of the phase of the strobe signal caused by changing the superimposed voltage is integral multiple of a period of a pattern signal.

For example, when the phase adjusting unit 46 gradually increases the superimposed voltage and continuously changes the phase of the strobe signal, the further correspondence between the phase of pattern signal and the phase of strobe signal occurs when the phase shift amount of the strobe signal is one time of the period of the pattern signal. In this case, the gain computing unit 48 can compute the timing shift gain by dividing the period of the pattern signal by the change amount of the superimposed voltage. It is preferable that the gain computing unit 48 previously stores a theoretical value of the period of the pattern signal.

Moreover, when the phase adjusting unit 46 continuously changes the phase of strobe signal in the vicinity of a phase obtained by shifting the phase of strobe signal by integral multiple of the period of pattern signal from when the phase of pattern signal and the phase of strobe signal have firstly been identical with each other, the further correspondence between the phase of pattern signal and the phase of strobe signal occurs when the phase shift amount of the strobe signal is the integral multiple of the period of the pattern signal. In this case, the gain computing unit 48 can compute the timing shift gain by dividing the integral multiple of the theoretical value of the period of the pattern signal by the change amount of the superimposed voltage.

In this manner, since the phase shift amount of the strobe signal is measured using a known period of the pattern signal as a standard, the phase shift amount can be measured easily. For this reason, it is possible to easily compute the timing shift gain.

Figure 4:
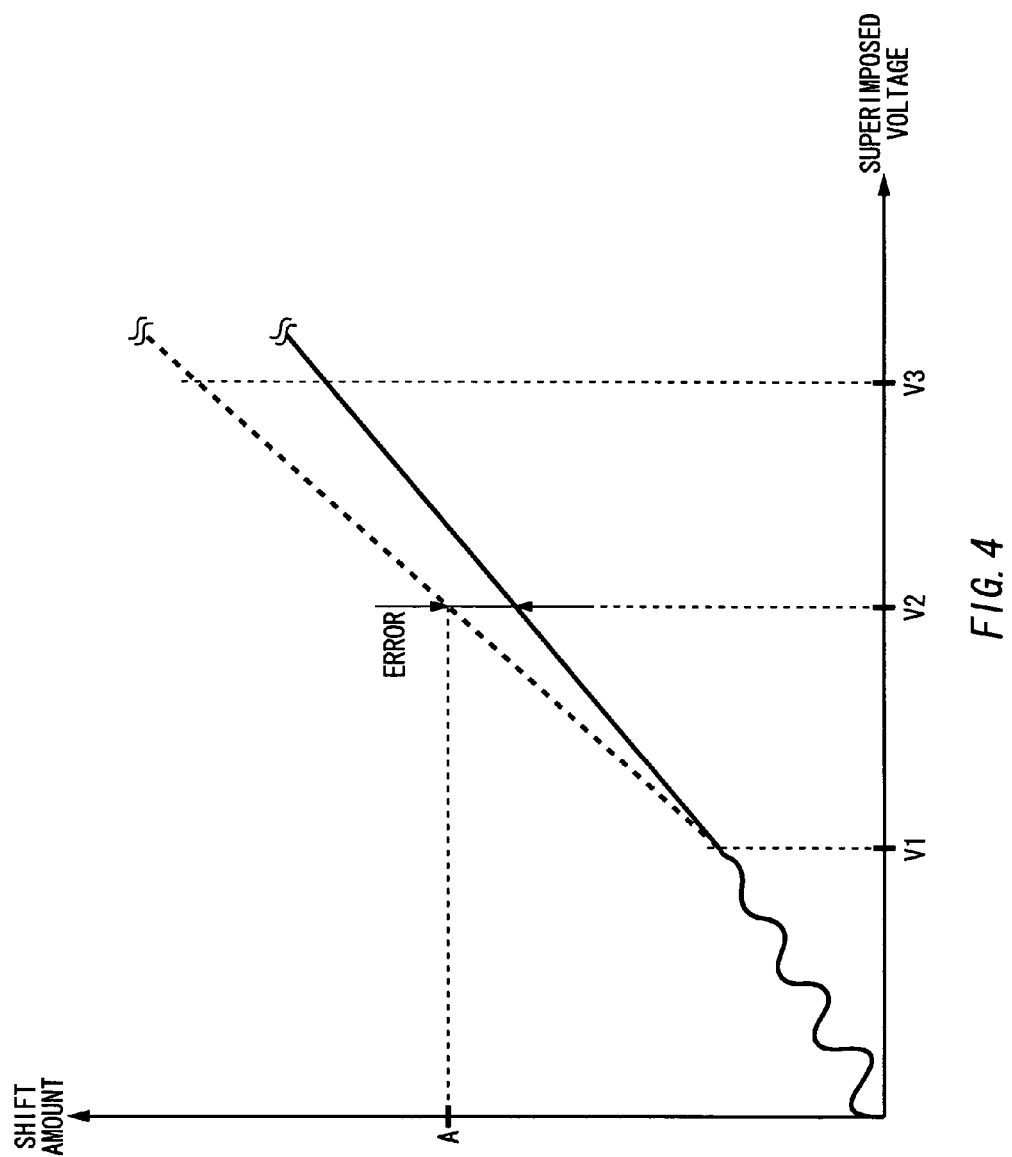
FIG. 4 is a view exemplary showing the relation between a superimposed voltage and an amount of phase shift of a strobe signal.

FIG. 4 is a view exemplary showing the relation between the superimposed voltage and the phase shift amount of the strobe signal. In FIG. 4, a vertical axis shows the phase shift amount and a horizontal axis shows the voltage value of the superimposed voltage. Moreover, in FIG. 4, an ideal value between the superimposed voltage and the shift amount characteristic is shown with a dotted line and an actual measurement value of the characteristic is shown with a solid line. The characteristic has a linear area (V1 to V3) as shown in FIG. 4. The range storing unit 54 described in FIG. 3 may store a range of the superimposed voltage corresponding to the linear area.

The ideal value and the actual measurement value of the characteristic have an error, e.g., a characteristic of the voltage-controlled oscillating unit 28. For this reason, when generating the superimposed voltage of V2 based on the ideal value of the characteristic in order to shift the phase of strobe signal by a shift amount of A, the actual shift amount of the phase of strobe signal may have an error with respect to A. Therefore, as described in FIG. 3, it is preferable to measure the characteristic and previously compute a timing shift gain.

Figure 5:
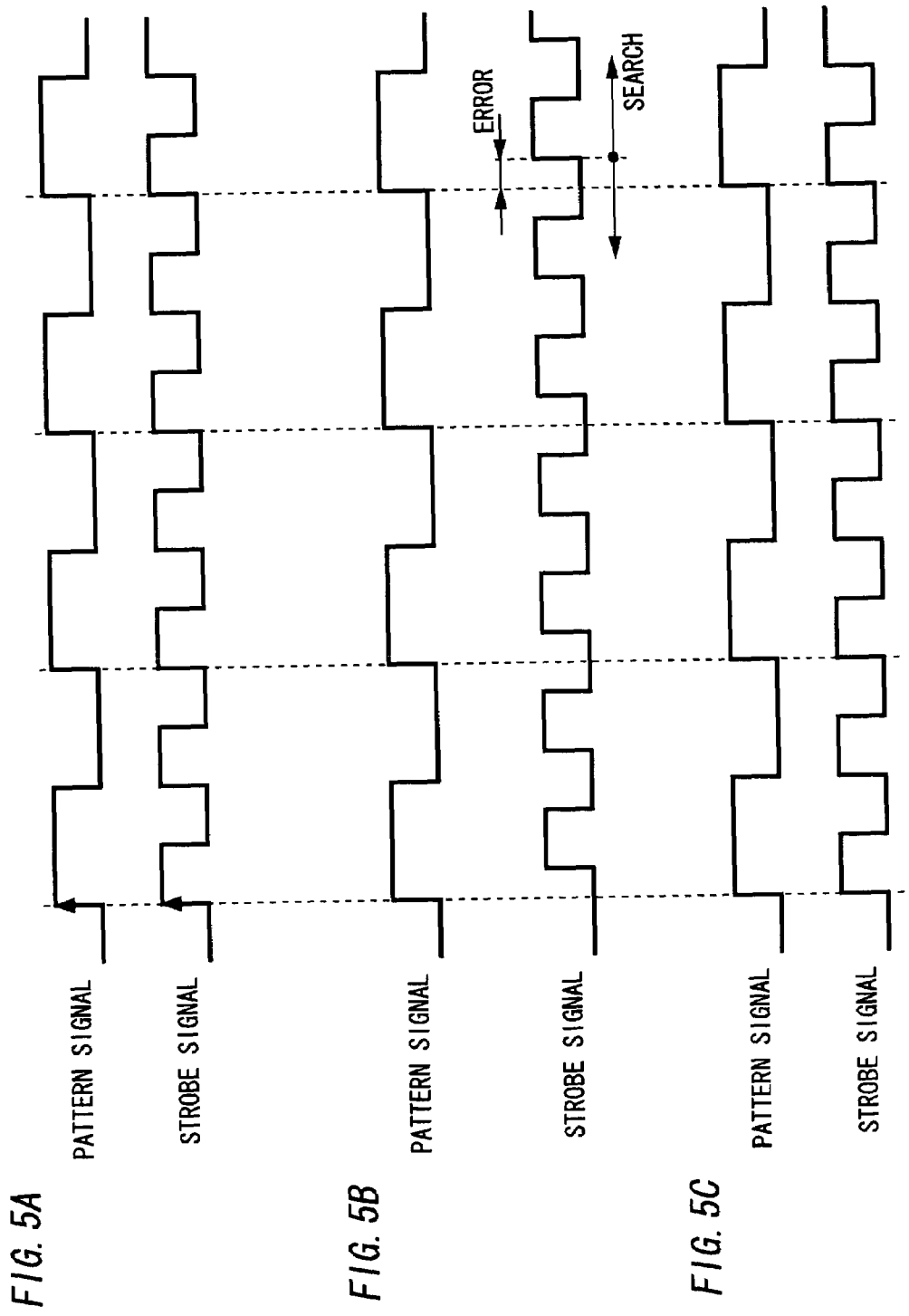
FIGS. 5A to 5C are timing charts exemplary showing an operation of an initializing unit.

FIGS. 5A to 5C are timing charts exemplary showing an operation of the initializing unit 56. At first, the phase adjusting unit 46 harmonizes the phase of strobe signal with the phase of pattern signal. In this way, as shown in FIG. 5A, a phase of a rising edge of the pattern signal and a phase of a rising edge of the strobe signal are identical with each other.

Then, the phase adjusting unit 46 generates a superimposed voltage corresponding to a phase shift amount of integral multiple of the period of the pattern signal, and superimposes the voltage on the control voltage. Here, the phase adjusting unit 46 is previously supplied with a designed value of the period of the pattern signal as the period of the pattern signal. In this way, as shown in FIG. 5B, the timing of the rising edge of the strobe signal is located in the vicinity of the timing of the rising edge of the pattern signal after the period of the integral multiple. At this time, as described in FIG. 4, the phase of strobe signal and the phase of pattern signal have an error.

Then, as shown in FIG. 5B, the phase adjusting unit 46 sequentially changes a superimposed voltage within a range in which the phase of strobe signal includes an amount of change of the predetermined integral multiple of the period of pattern signal, searches the superimposed voltage at which the phase of strobe signal is identical with the phase of pattern signal, and harmonizes the phase of strobe signal with the phase of pattern signal as shown in FIG. 5C.

At this time, it is preferable that the phase adjusting unit 46 sequentially changes the superimposed voltage so that the phase of strobe signal is changed within a range below one period of the pattern signal in each of before and after the change amount of the predetermined integral multiple of the period of the pattern signal. For example, in FIG. 5B, because searching a superimposed voltage at which the timing of a rising edge of the fourth pulse of pattern signal and the timing of a rising edge of the seventh pulse of strobe signal are identical with each other, the superimposed voltage is changed so that the timing of a rising edge of the seventh pulse of strobe signal varies within a range larger than the timing of a rising edge of the third pulse of pattern signal and smaller than the timing of a rising edge of the fifth pulse of pattern signal. In this way, it is possible to detect a superimposed voltage in which the phase of strobe signal is shifted by the integral multiple of the period of pattern signal without an error.

Figure 6:
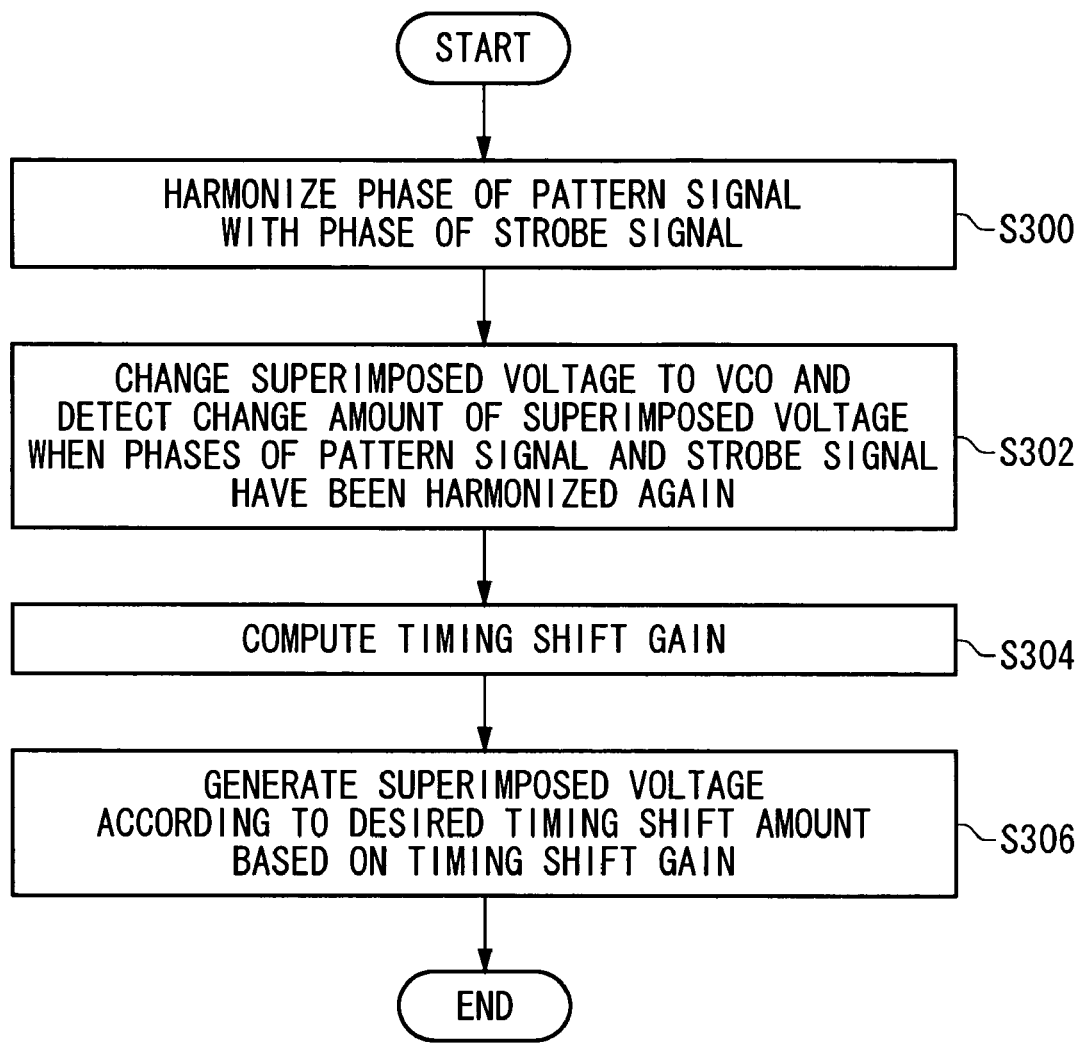
FIG. 6 is a flowchart exemplary showing a timing generating method according to an embodiment of the present invention.

FIG. 6 is a flowchart exemplary showing a timing generating method according to an embodiment of the present invention. The timing generating method is a method of generating a strobe signal of desired timing by means of the timing generator 20 described in FIG. 2. The timing generating method includes an initializing step (S300 to S304) of measuring a timing shift gain indicative of a ratio of a timing shift amount of an oscillation signal output from the voltage-controlled oscillating unit 28 to a change of a superimposed voltage and a voltage generating step (S306) of generating the superimposed voltage based on the timing shift amount according to the desired timing at which a strobe signal should be output and the timing shift gain.

In the initializing step, at first in a first phase adjusting step S300, a phase of at least one of the phase of pattern signal and the phase of strobe signal is shifted with respect to the other, and the phase of pattern signal and the phase of strobe signal are harmonized. According to the first phase adjusting step S300, the phase of pattern signal and the phase of strobe signal are harmonized in a similar method to that of the phase adjusting unit 46 described in FIG. 3.

Next, in a second phase adjusting step S302, a voltage value is sequentially changed from the superimposed voltage detected in the first phase adjusting step S300, and an amount of change of the superimposed voltage when the phase of pattern signal and the phase of strobe signal are identical with each other once more is detected. According to the second phase adjusting step S302, the change amount of the superimposed voltage is detected in a similar method to that of the phase adjusting unit 46 described in FIG. 3.

Next, in a gain computing step S304, the timing shift gain is computed based on the change amount of the superimposed voltage detected in the second phase adjusting step S302 and the change amount of the phase of the strobe signal to the pattern signal caused by changing the superimposed voltage. According to the gain computing step S304, the timing shift gain is computed in a similar method to that of the gain computing unit 48 described in FIG. 3.

Then, in the voltage generating step S306, the superimposed voltage according to the timing shift amount is generated. By such a method, it is possible to easily generate a strobe signal that is controlled at desired timing with high precision.

As described above, the timing generator 20 may output the timing signal to be supplied to a driver (a waveform shaper 13) included in the test apparatus 100 and the strobe signal to be supplied to a comparator (a signal detector 12) included in the test apparatus 100 at the desired timing. In this case, the timing signal and the strobe signal are generated by PLL circuits different from each other. Then, the timing generator 20 may respectively compute the timing shift gain for the timing signal and the timing shift gain for the strobe signal by means of the method described in FIGS. 1 to 6.

Moreover, although the phase difference between the timing signal and the strobe signal has been controlled to have a desired value by shifting the phase of strobe signal, in another example, the phase difference maybe controlled to have a desired value by shifting the phase of timing signal. In this case, the method described in FIGS. 1 to 6 can easily be performed by replacing a process for the strobe signal with a process for the timing signal.

Moreover, although there has been described the method of controlling the phase difference between the timing signal and the strobe signal used for the test apparatus 100 to have a desired value, the timing generating method is not limited to a timing of controlling the phase difference between periodic signals used for the test apparatus 100. In other words, even in case of using the first periodic signal of predetermined frequency and the second periodic signal of predetermined frequency, it is possible to easily control the phase difference between the first periodic signal and the second periodic signal by means of the method described in FIG. 5.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to control the phase difference between periodic signals in a simple method and with high precision. Moreover, since a timing signal and a strobe signal between which the phase difference is controlled by the method are used, it is possible to decide the good or bad of a device under test with high precision.

What is claimed is:

1. A timing generator that outputs a second periodic signal having a predetermined phase difference to a first periodic signal, comprising:

a voltage-controlled oscillating unit for outputting an oscillation signal with frequency according to a given control voltage as the second periodic signal; and a timing controlling unit for superimposing a superimposed voltage according to the phase difference of the second periodic signal to the first periodic signal on the control voltage in order to supply the voltage to said voltage-controlled oscillating unit, wherein said timing controlling unit comprises:

an initializing unit for measuring a timing shift gain indicative of a ratio of a timing shift amount of the oscillation signal output from said voltage-controlled oscillating unit to a change of the superimposed voltage; and a voltage generating unit for generating the superimposed voltage based on a timing shift amount according to the predetermined phase difference of the second periodic signal and the timing shift gain, and the initializing unit comprises:

a first phase adjusting means for shifting a phase of at least one of the first periodic signal and the second periodic signal with respect to a phase of the other and harmonizing the phase of the first periodic signal with the phase of the second periodic signal;

a second phase adjusting means for sequentially changing the superimposed voltage supplied by the voltage generating unit to said voltage-controlled oscillating unit and detecting an amount of change of the superimposed voltage when the phase of the first periodic signal and the phase of the second periodic signal are identical with each other once more, on condition that an amount of phase shift by the first phase adjusting means is held; and a gain computing unit for computing the timing shift gain based on an amount of change of phase of the second periodic signal to the first periodic signal caused by changing the change amount of the superimposed voltage detected from the second phase adjusting means and the superimposed voltage.

2. The timing generator as claimed in claim 1, wherein the second phase adjusting means sequentially changes the superimposed voltage generated from the voltage generating unit so that the phase of the second periodic signal is changed within a range including an amount of change of a predetermined integral multiple of a period of the first periodic signal.

3. The timing generator as claimed in claim 2, wherein
the second phase adjusting means sequentially changes the superimposed voltage so that the phase of the second periodic signal is changed within a range below one period of the first periodic signal before and behind the change amount of the predetermined integral multiple of a period of the first periodic signal, and
the gain computing unit computes the timing shift gain by dividing a shift amount of the predetermined integral multiple of a period of the first periodic signal by the change amount of the superimposed voltage.

4. The timing generator as claimed in claim 3, wherein
the timing generator further comprises a range storing unit for previously storing information indicative of a range of the superimposed voltage in which said voltage-controlled oscillating unit operates linearly,
the voltage generating unit previously generates the generally lowest superimposed voltage within the range stored on the range storing unit when the first phase adjusting means harmonizes the phase of the first periodic signal with the phase of the second periodic signal, and
the first phase adjusting means further changes the phase of the second periodic signal and harmonizes the phase of the first periodic signal with the phase of the second periodic signal, on condition that the generally lowest superimposed voltage is superimposed on the control voltage.

5. The timing generator as claimed in claim 2, wherein the gain computing unit previously stores a theoretical value of a period of the first periodic signal and computes the timing shift gain by dividing a value, which is obtained by multiplying the theoretical value of a period of the first periodic signal by the predetermined integer, by the change amount of the superimposed voltage.

6. A test apparatus testing a device under test, comprising:
a pattern generating unit for supplying a test pattern to the device under test according to a given timing signal;
a signal detector for detecting a signal value of an output signal output from the device under test according to the test pattern at the timing of a given strobe signal;
a timing generator for generating the timing signal and the strobe signal and supplying these signals to said pattern generating unit and said signal detector; and
a decider for deciding the good or bad of the device under test based on the signal value detected from said signal detector, wherein
said timing generator comprises:
a first voltage-controlled oscillating unit for outputting an oscillation signal with frequency according to a given control voltage as the timing signal;
a second voltage-controlled oscillating unit for outputting an oscillation signal with frequency according to a given control voltage as the strobe signal; and
a timing controlling unit for superimposing a superimposed voltage according to the phase difference between a strobe signal and the timing signal, on the control voltage in order to supply the voltage to the first voltage-controlled oscillating unit and the second voltage-controlled oscillating unit,
the timing controlling unit comprises:
an initializing unit for measuring a timing shift gain indicative of a ratio of a timing shift amount of the oscillation signal, which is output from the first voltage-controlled oscillating unit and the second voltage-controlled oscillating unit, to a change of the superimposed voltage; and a voltage generating unit for generating the superimposed voltage based on a timing shift amount according to phase difference between the strobe signal and the timing signal and the timing shift gain, and
the initializing unit comprises:
a first phase adjusting means for shifting a phase of at least one of the timing signal and the strobe signal with respect to a phase of the other and harmonizing the phase of the timing signal with the phase of the strobe signal;
a second phase adjusting means for sequentially changing the superimposed voltage supplied by the voltage generating unit to the voltage-controlled oscillating unit and detecting an amount of change of the superimposed voltage when the phase of the first periodic signal and the phase of the second periodic signal are identical with each other once more, on condition that an amount of phase shift by the first phase adjusting means is held; and
a gain computing unit for computing the timing shift gain based on an amount of change of phase of the second periodic signal to the first periodic signal caused by changing the change amount of the superimposed voltage detected from the second phase adjusting means and the superimposed voltage.

7. A timing generating method of generating a second periodic signal having a predetermined phase difference to a first periodic signal, comprising:
a voltage-controlled oscillating step of outputting an oscillation signal with frequency according to a given control voltage as the second periodic signal; and
a timing controlling step of superimposing a superimposed voltage according to the phase difference of the second periodic signal to the first periodic signal on the control voltage in order to supply the voltage to said voltage-controlled oscillating step, wherein
said timing controlling step comprises:
an initializing step of measuring a timing shift gain indicative of a ratio of a timing shift amount of the oscillation signal output from said voltage-controlled oscillating step to a change of the superimposed voltage; and
a voltage generating step of generating the superimposed voltage based on a timing shift amount according to the predetermined phase difference of the second periodic signal and the timing shift gain, and
the initializing step comprises:
a first phase adjusting step of shifting a phase of at least one of the first periodic signal and the second periodic signal with respect to a phase of the other and harmonizing the phase of the first periodic signal with the phase of the second periodic signal;
a second phase adjusting step of sequentially changing the superimposed voltage supplied by the voltage generating step to said voltage-controlled oscillating step and detecting an amount of change of the superimposed voltage when the phase of the first periodic signal and the phase of the second periodic signal are identical with each other once more, on condition that an amount of phase shift in the first phase adjusting step is held; and
a gain computing step of computing the timing shift gain based on an amount of change of phase of the second periodic signal to the first periodic signal caused by changing the change amount of the superimposed voltage detected in the second phase adjusting step and the superimposed voltage.

* * * * *